(12) United States Patent
Wang et al.

(10) Patent No.: US 10,533,875 B2
(45) Date of Patent: Jan. 14, 2020

(54) PROGRAMMABLE INTERPOLATION MODULE FOR A SENSOR SYSTEM

(71) Applicant: The Timken Company, North Canton, OH (US)

(72) Inventors: Lei Wang, Solon, OH (US); Alfred J. Santos, Keene, NH (US); Mark E. Lacroix, Winchester, NH (US)

(73) Assignee: The Timken Company, North Canton, OH (US)

(*) Notice: Subject to any disclaimer, the term of this patent is extended or adjusted under 35 U.S.C. 154(b) by 298 days.

(21) Appl. No.: 15/324,859

(22) PCT Filed: Aug. 13, 2014

(86) PCT No.: PCT/US2014/050820
§ 371 (c)(1),
(2) Date: Jan. 9, 2017

(87) PCT Pub. No.: WO2016/024958
PCT Pub. Date: Feb. 18, 2016

(65) Prior Publication Data
US 2017/0211946 A1 Jul. 27, 2017

(51) Int. Cl.
*G01D 3/02* (2006.01)
*G01D 5/14* (2006.01)
(Continued)

(52) U.S. Cl.
CPC .............. *G01D 3/022* (2013.01); *G01D 5/145* (2013.01); *G01R 33/0005* (2013.01); *G01R 33/0023* (2013.01); *G01R 33/07* (2013.01)

(58) Field of Classification Search
CPC .... G01D 3/022; G01D 5/145; G01R 33/0005; G01R 33/0023; G01R 33/07
(Continued)

(56) References Cited

U.S. PATENT DOCUMENTS 6,242,906 B1 * 6/2001 Andermo ........... G01D 5/24452
324/207.12
6,304,079 B1 * 10/2001 Kenjo ................... G01D 5/145
324/207.21
(Continued)

FOREIGN PATENT DOCUMENTS

CN 101131329 A 2/2008
CN 101213423 A 7/2008
(Continued)

OTHER PUBLICATIONS

International Search Report and Written Opinion for Application No. PCT/US2014/050820 dated Apr. 10, 2015.
(Continued)

*Primary Examiner* — Melissa J Koval
*Assistant Examiner* — Rahul Maini
(74) *Attorney, Agent, or Firm* — Michael Best & Friedrich LLP

(57) ABSTRACT

A sensor system including a movable member, a sensor, and an interpolator. The sensor is configured to generate a first output signal and a second output signal. The first output signal has a first phase angle, the second output signal has a second phase angle, and a first difference between the first phase angle and the second phase angle has a first value. The first value of the first difference includes an offset related to a mechanical incompatibility between the sensor and the movable member. The interpolator is configured to receive the first output signal and the second output signal. The interpolator is operable to apply a compensation factor to generate a third signal having a third phase. The compensation factor has a value that is based on the mechanical incompatibility between the sensor and the movable member.

21 Claims, 8 Drawing Sheets

(51) Int. Cl.
  *G01R 33/00* (2006.01)
  *G01R 33/07* (2006.01)
(58) Field of Classification Search
  USPC .................................................. 324/207.12
  See application file for complete search history.

(56) References Cited

U.S. PATENT DOCUMENTS

| | | | |
|---|---|---|---|
| 6,889,151 | B2 | 5/2005 | Freitag et al. |
| 6,973,399 | B1 | 12/2005 | Burgschat et al. |
| 7,012,420 | B2 * | 3/2006 | Rodi .................... G01D 5/2448 |
| | | | 324/207.12 |
| 2005/0179429 | A1 | 8/2005 | Lohberg |
| 2010/0059042 | A1 | 3/2010 | Chang et al. |
| 2010/0091926 | A1 | 4/2010 | Kishibe et al. |

FOREIGN PATENT DOCUMENTS

| | | | |
|---|---|---|---|
| CN | 100414255 C | 8/2008 | |
| DE | 102009022084 | 11/2010 | |
| EP | 1544579 A1 * | 6/2005 | ........... G01D 5/2448 |
| EP | 1672321 | 6/2006 | |
| KR | 1020040102113 A | 12/2004 | |
| KR | 1020080012823 A | 2/2008 | |

OTHER PUBLICATIONS

Korean Patent Office Action for Application No. 10-2017-7003487 dated May 27, 2018 (12 pages, English translation included).
Chinese Patent Office Action for Application No. 201480081201.7 dated Nov. 27, 2018 (14 pages).

* cited by examiner

PROGRAMMABLE INTERPOLATION MODULE FOR A SENSOR SYSTEM

BACKGROUND

This invention relates to an interpolation module or interpolator for a sensor system.

SUMMARY

Interpolators are incorporated into encoder devices that are used, for example, for position or speed detection. As an illustrative example, an encoder can include a moving member and an array of sensors that can be used to detect a position or speed of the moving member. Based on output signals from the sensors, the precise position or speed information for the encoder can be determined.

However, an array of sensors that produces accurate position or speed data for one moving member may not produce accurate position or speed data for a different moving member. There are a variety of reasons why the sensors may produce accurate and reliable data for one moving member and unreliable and inaccurate data for another. For example, with specific reference to a rotary incremental encoder (e.g., a rotary encoder that includes a rotating member for speed and position detection), one rotating member may be larger than another rotating member. Each rotating member is coded with a periodic pattern, and a plurality of Hall Effect sensing elements in a sensor array is used over the length of the pattern to generate output signals (e.g., two sinusoidal waveforms).

Ideally, the length of the sensor element array substantially exactly matches the length of the pattern on the moving member such that two 90° phase shifted sinusoidal signals are generated. For example, if the pole width of a magnetic target is assigned a length of 180° between the center of the South Pole and the center of the North Pole, 90° corresponds to the junction between the North Pole and the South Pole. In such an instance, for a two sensor array, the length of the sensor array (i.e., the distance from the first sensor to the second sensor) should be approximately equal to the length from the junction between the North Pole and the South Pole and one of the center of the South Pole and the center of the North Pole. For a four sensor array with four sensor elements equally spaced along a straight line or curvature, the length of the sensor array (i.e., the distance from the first sensor element to the fourth sensor element) should be approximately equal to 3/2 of the pole width (i.e., the distance from the center of one pole to the center of an adjacent pole). For example, in one position, the first sensor is aligned with the center of the South Pole, the second sensor is aligned with the junction between the North Pole and South Pole, the third sensor is aligned with the center of the North Pole, and the fourth sensor is aligned with the junction between the North pole and a subsequent South Pole. However, mechanical or physical incompatibilities or inconsistencies can exist within the sensor system or encoder. For a rotary incremental encoder, the sensors are controlled to generate a pair of output signals (e.g., sinusoidal waveforms) that have a 90° phase difference (i.e., the output signals are in quadrature with one another). The output signals are then interpolated using a circuit known as an interpolator to generate high resolution waveforms. On the moving member, the pattern length is the length of a periodic pattern and the pitch of the pattern is the distance between two adjacent patterns. The pattern length and the pitch are usually selected to be specific values for a particular design, and the sensor array length and pattern length are designed to be compatible with (e.g., match) one another.

However, if the sensor array length and the pattern length do not match one another, or if the target and the sensor array are misaligned during installation, the generated pair of output signals do not have a precise 90° phase difference. If the signals do not have a substantially 90° phase difference, errors may be introduced in the high resolution output from the interpolator. As such, in most encoders, the sensor array and pattern on the target are specifically designed to match one another to avoid the introduction of such errors. Adjusting for mismatches can include, for example, mechanically adjusting a twist angle between the target and the sensor array, using a large size, mix-signal vector processing circuit to adjust input signal phase, etc. However, it is difficult to accurately adjust a twist angle of an encoder, and implementing a vector processing circuit can be costly due to the computational resources that are required for the interpolator.

As such, the invention described herein relates to a programmable interpolator for a sensor system that can be used to compensate for mechanical incompatibilities such as mismatches between the length of a sensor array and a length of a target pattern or misalignments during installation. A sensor system includes, for example, a moving member such as a rotating member, a sensor array (e.g., including two or more sensors), and circuitry that receives output signals from the sensors. The circuitry can include a front end (e.g., amplifiers, filters, etc., for conditioning the output signals of the sensors) and an interpolator or interpolation module for generating high resolution signals related to, for example, a position or speed of the target. For a rotary encoder, each sensor in the sensor array generates output signals corresponding to their relative positions and phases with respect to the target pattern. Quadrature sinusoidal waveforms (e.g., waveforms that should have a 90° phase difference) are then generated from the sensor array output signals. If there is a mechanical incompatibility between the rotating member and the sensors, a module within the interpolator can compensate the signals within the interpolator to account for the mismatch and ensure that the signals are corrected or compensated (i.e., such that the phase difference of the incoming signals matches the phase difference of generated feedback signals within the interpolator). In some embodiments, the compensation module of the interpolator is designed to be linearly proportional to, for example, a pole width (e.g., width between North/South poles) of the pattern and can be adjusted with a high degree of accuracy. The compensation module allows for a wider range of design dimensions for the moving member because errors or physical mismatches can be accounted for, which allows for variations in pattern length, pole widths, pitch, etc. In some constructions, the programmable interpolator can be implemented using a logic circuit to reduce overall design complexity and to reduce circuit size. In other constructions, the programmable interpolator can be implemented using a microprocessor, microcontroller, or another control device.

In one embodiment, the invention provides a sensor system that includes a movable member, a sensor, and an interpolator. The sensor is configured to generate a first output signal and a second output signal. The first output signal has a first phase angle, the second output signal has a second phase angle, and a first difference between the first phase angle and the second phase angle has a first value. The first value of the first difference includes an offset related to a mechanical incompatibility between the sensor and the movable member. The interpolator is configured to receive the first output signal and the second output signal. The interpolator is operable to apply a compensation factor to generate a third signal having a third phase angle and generate a fourth signal having a fourth phase angle. A second difference between the third phase angle and the fourth phase angle has a second value. The second value of the second difference substantially equals the first value of the first difference, and the compensation factor has a value that is based on the mechanical incompatibility between the sensor and the movable member.

In another embodiment, the invention provides a method of compensating for a mechanical incompatibility between a movable member and a sensor in an encoder. The method includes generating a first output signal and a second output signal, receiving, at an interpolation module, the first output signal and the second output signal, determining a compensation factor, the compensation factor having a value that is based on the mechanical incompatibility between the sensor and the movable member, generating a third signal using the compensation factor, the third signal having a third phase angle, and generating a fourth signal that has a fourth phase angle. The first output signal has a first phase angle, the second output signal has a second phase angle, and a first difference between the first phase angle and the second phase angle has a first value. The first value of the first difference includes an offset related to the mechanical incompatibility between the sensor and the movable member. A second difference between the third phase angle and the fourth phase angle has a second value, and the second value of the second difference substantially equals the first value of the first difference.

In another embodiment, the invention provides a sensor system that includes a rotary member including a pattern of magnetic poles, a Hall Effect sensor, and a controller. The Hall Effect sensor is configured to generate a first output signal and a second output signal based on the pattern of magnetic poles. The first output signal has a first phase angle, the second output signal has a second phase angle, and a first difference between the first phase angle and the second phase angle has a first value. The first value of the first difference includes an offset related to a mechanical incompatibility between the Hall Effect sensor and the rotary member. The controller is configured to receive the first output signal and the second output signal. The controller is operable to apply a compensation factor to generate a third signal having a third phase angle and generate a fourth signal having a fourth phase angle. A second difference between the third phase angle and the fourth phase angle has a second value. The second value of the second difference substantially equals the first value of the first difference, and the compensation factor has a value that is set based on the mechanical incompatibility between the Hall Effect sensor and the rotary member.

Other aspects of the invention will become apparent by consideration of the detailed description and accompanying drawings.

DETAILED DESCRIPTION

Figure 1:
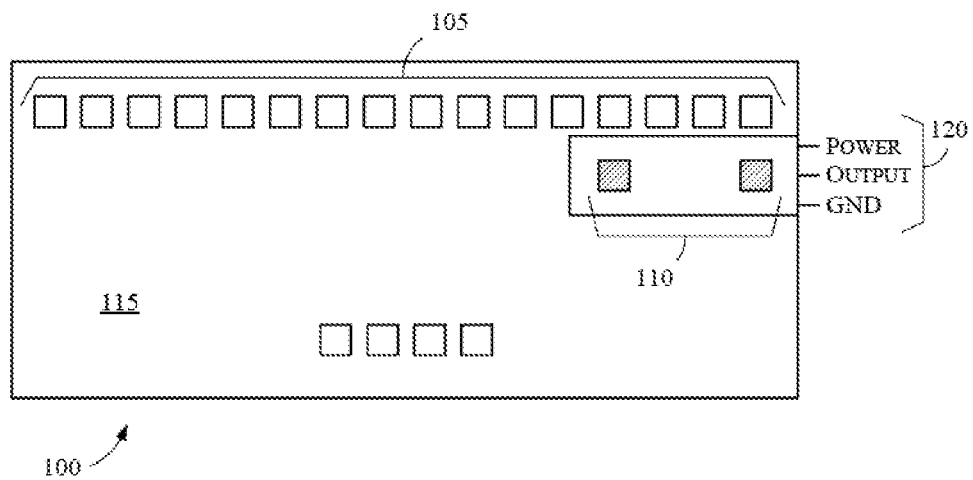
FIG. 1 illustrates a portion of a sensor system.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limited. The use of "including," "comprising" or "having" and variations thereof herein is meant to encompass the items listed thereafter and equivalents thereof as well as additional items. The terms "mounted." "connected" and "coupled" are used broadly and encompass both direct and indirect mounting, connecting and coupling. Further, "connected" and "coupled" are not restricted to physical or mechanical connections or couplings, and can include electrical connections or couplings, whether direct or indirect. Also, electronic communications and notifications may be performed using any known means including direct connections, wireless connections, etc.

It should be noted that a plurality of hardware and software based devices, as well as a plurality of different structural components may be utilized to implement the invention. Furthermore, and as described in subsequent paragraphs, the specific configurations illustrated in the drawings are intended to exemplify embodiments of the invention and that other alternative configurations are possible. The terms "processor" "central processing unit" and "CPU" are interchangeable unless otherwise stated. Where the terms "processor" or "central processing unit" or "CPU" are used as identifying a unit performing specific functions, it should be understood that, unless otherwise stated, those functions can be carried out by a single processor, or multiple processors arranged in any form, including parallel processors, serial processors, tandem processors or cloud processing/cloud computing configurations.

The invention described herein relates to an encoder, such as a linear or rotary encoder, that is capable of compensating for an offset that results from a physical or mechanical mismatch or misalignment between components of the encoder. For example, a rotary incremental encoder includes a rotating member and a sensor array (e.g., including two or more sensors) for determining position and speed. The rotating member includes a pattern having a pattern length that includes, for example, alternating North and South magnetic poles. The magnetic poles have a pole width that corresponds to the width of an individual pole or the width between poles having the same polarity. Ideally, the pattern length, pole width, and the length of the sensor array are precisely designed such that the pattern length and the length of the sensor array are matched. However, mechanical incompatibilities such as variations in pattern length (which can be a function of the diameter of the rotating member) or variations in pole width can cause output signals from the sensor array to be processed incorrectly, which introduces errors into the speed and position detection by the system. The invention includes a compensation module within an interpolator of the encoder that can compensate for these physical or mechanical variations within the encoder and increase the accuracy of the sensing system. For example, the invention can include an array of Hall Effect sensors and a rotating member in a rotary incremental encoder. Due to a mismatch or misalignment of the rotating member and the sensor array, a pair of output signals (e.g., quadrature signals) generated from each of the Hall Effect sensors includes an error in phase difference. The signals should have a phase difference of substantially 90°, but the mismatch or misalignment causes the phase difference to be greater than or less than 90°. The interpolator for the encoder is then configured to match the phase difference for internally-generated, high-resolution data signals to the phase difference for the incoming signals from the Hall Effect sensors. When the internal interpolator signals have a phase difference that matches the phase difference of the incoming signals, the offset from the mismatch or misalignment within the encoder has been compensated or corrected. The compensation can be performed in an offline manner (e.g., compensation data is preset programmed data), in an online manner (e.g., compensation functions are executed after the encoder is installed or deployed with a machine, when the machine is running, etc.), or combinations thereof.

Although the invention is described primarily with a rotary incremental encoder using magnetic poles and Hall Effect sensors, the invention can also be applied to absolute encoders, linear encoders, and encoders using sensors other than Hall Effect sensors. For illustrative purposes, the invention is described herein with respect to a rotary incremental encoder using Hall Effect sensors. Specifically, FIG. 1 illustrates a portion of a Hall Effect sensor system or encoder 100 that includes a high resolution Hall Effect sensor array 105 and one or more independent Hall Effect sensors 110. In some constructions, the sensor elements of the sensor system 100 are contained on a single integrated circuit 115. In other constructions, the independent Hall Effect sensors 110 have power, output, and ground connections 120 that are separate from the connections to the high resolution Hall Effect sensor array 105 (i.e., none of the power, output, and ground connections 120 are connected to the high resolution Hall Effect sensor circuit). Among the advantages of having separate power, output, and ground connections 120 is a reduced risk of electrostatic discharge ("ESD") damage to the high resolution sensor array 105 and the independent Hall Effect sensors 110. The independent Hall Effect sensors 110 generate analog or digital output signals. In some constructions, the high resolution Hall Effect sensor array 105 is similar to Timken model MPS32XF or MPS160 sensor arrays.

Figure 2:
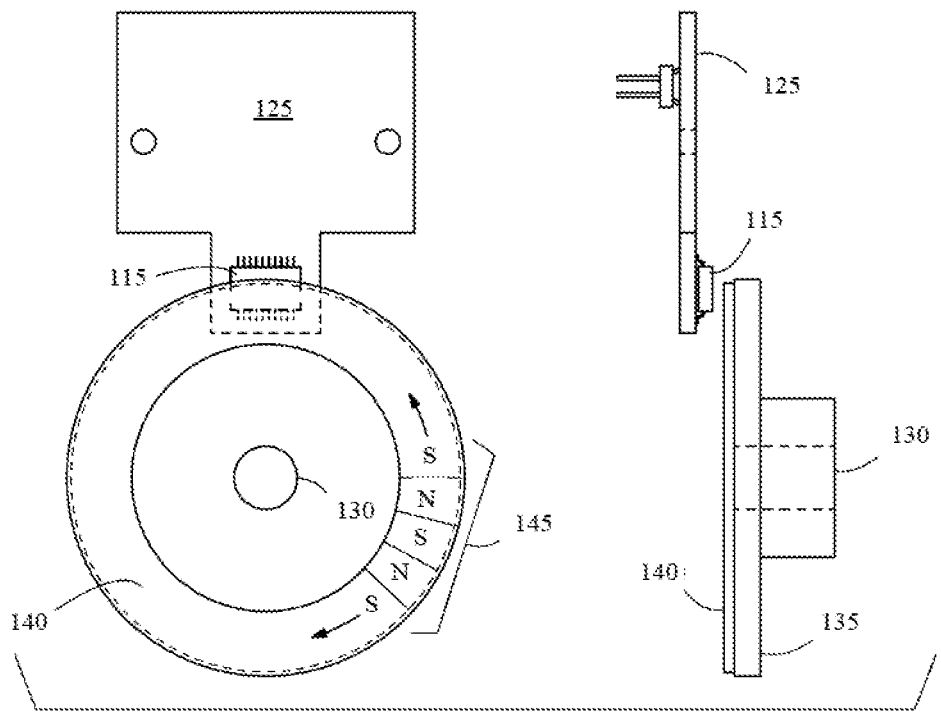
FIG. 2 illustrates a sensor system that includes a sensor array located adjacent to a rotatable member that includes alternating magnetic poles.

The portion of the sensor system 100 of FIG. 1 can be used with a movable member such as a rotatable member 130 (e.g. a wheel or shaft of a rotary encoder), as shown in FIG. 2. The portion of the sensor system 100 of FIG. 1 is illustrated in FIG. 2 as an integrated circuit 115 mounted on a circuit board 125. The high resolution sensor array 105 is disposed adjacent to a circular plate 135 having a magnetic region 140 at the outer edge with a plurality of alternating magnetic poles 145 embedded therein. The circular plate 135 may be attached to the rotatable member 130 or may be an integral part of the rotatable member 130.

Figure 3A:
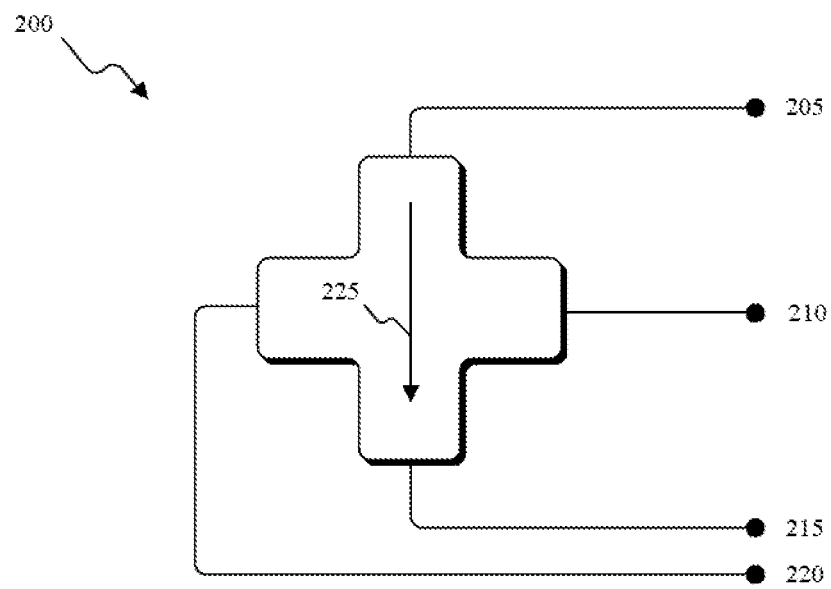
FIGS. 3A and 3B illustrate a Hall Effect sensor.
Figure 3B:
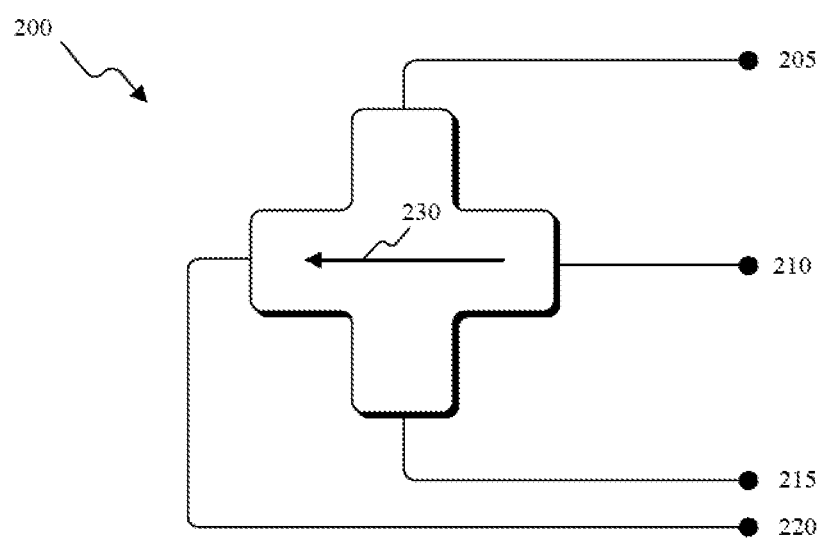

FIGS. 3A and 3B illustrate a single Hall Effect sensor 200 that includes four electrodes 205, 210, 215, and 220. Output signals for the Hall Effect sensor 200 are generated in quadrature using what is known as a "spinning current" technique. In the spinning current technique, switching circuitry periodically switches off or disconnects a current source from a first pair of electrodes 205 and 215 to prevent the flow of a bias current through the Hall Effect sensor 200 in a first direction 225, and then applies a bias current to a second pair of electrodes 210 and 220 to allow a bias current to flow through the Hall Effect sensor in a second direction 230. The switching circuitry similarly disconnects, for example, a front end circuit (e.g., including an output amplifier) from the second pair of electrodes 210 and 220, and connects the front end circuit to the first pair of electrodes 205 and 215 (see FIG. 4). As such, in FIG. 3A, a bias current is initially applied to the first pair of electrodes 205 and 215 and the second pair of electrodes 210 and 220 is used for sensing. In FIG. 3B, the bias current is applied to the second pair of electrodes 210 and 220 and the first pair of electrodes 205 and 215 are used for sensing. Thus, in FIG. 3B, the bias current flows through the Hall Effect sensor 200 in a direction 230 transverse to the direction 225 of the bias current shown in FIG. 3A. The switching of the electrodes 205, 210, 215, and 220 can be accomplished using, for example, a controller, a microcontroller, a microprocessor, an ASIC, an FPGA, etc. The switching associated with the spinning current technique is known in the art.

Figure 4:
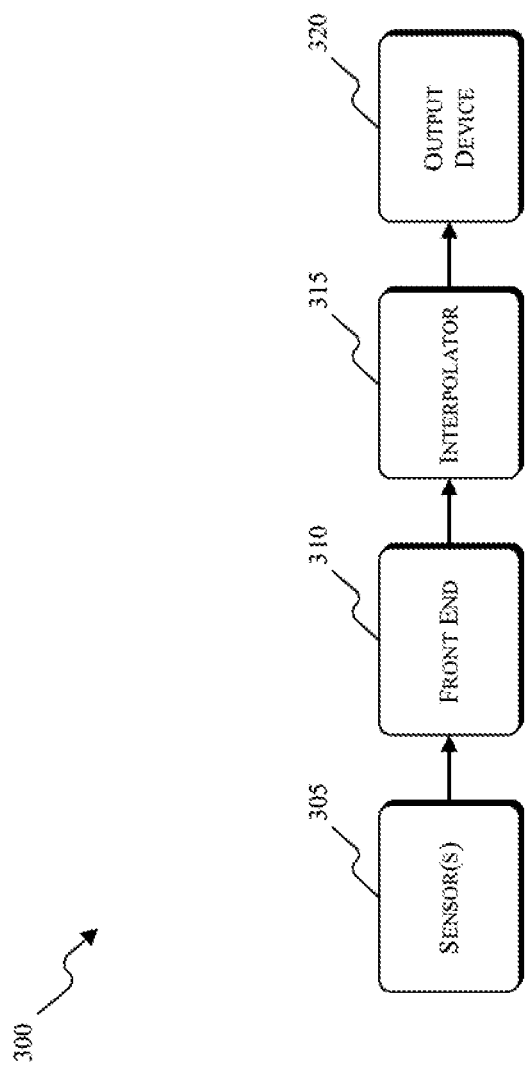
FIG. 4 is a block diagram of a sensor system according to an embodiment of the invention.

FIG. 4 illustrates a system block diagram 300 of the sensor system 100 of FIGS. 1 and 2. The system 100 includes sensor(s) 305 (e.g., one or more Hall Effect sensor(s) 305 similar to that shown in FIGS. 3A and 3B), a front end circuit 310, an interpolator 315, and an output device 320. The front end circuit 310 is, for example, a combination of active and passive circuit components that condition the output signals of the sensor(s) 305. The front end circuit 310 can include amplifiers, filters, gain control circuitry, analog-to-digital converters ("ADCs"), etc., for conditioning the output signals from the sensor(s) 305 prior to the conditioned output signals being provided to the interpolator 315.

The interpolator 315 generates high-resolution output signals for the sensor system 100 that can be provided to the output device 320. In various constructions, the interpolator 315 is implemented using hardware, software, or a combination of hardware and software. The interpolator 315 can, for example, be implemented as a controller, a microcontroller, a microprocessor, an application specific integrated circuit ("ASIC"), a field programmable gate array ("FPGA"), a logic circuit, etc. The operation of the interpolator 315 is described in greater detail below. The output device 320 is, for example, a device that receives the high resolution signals from the interpolator and performs further processing or control for a system (e.g., a motor system) based on detected position and/or speed. In some constructions, the output device 320 is a controller, a microcontroller, a microprocessor, an ASIC, an FPGA, etc.

In some constructions, the interpolator 315 and/or the output device 320 are implemented with a control or processing device. For example, the interpolator 315 and the output device 320 are implemented using a microprocessor-based system that generates the high resolution output signals for the Hall Effect sensor(s) 305, is capable of determining position, speed, and acceleration for the encoder, and is capable of generating one or more output control signals for controlling a system (e.g., a motor system). Such a construction is illustrated in FIG. 5.

Figure 5:
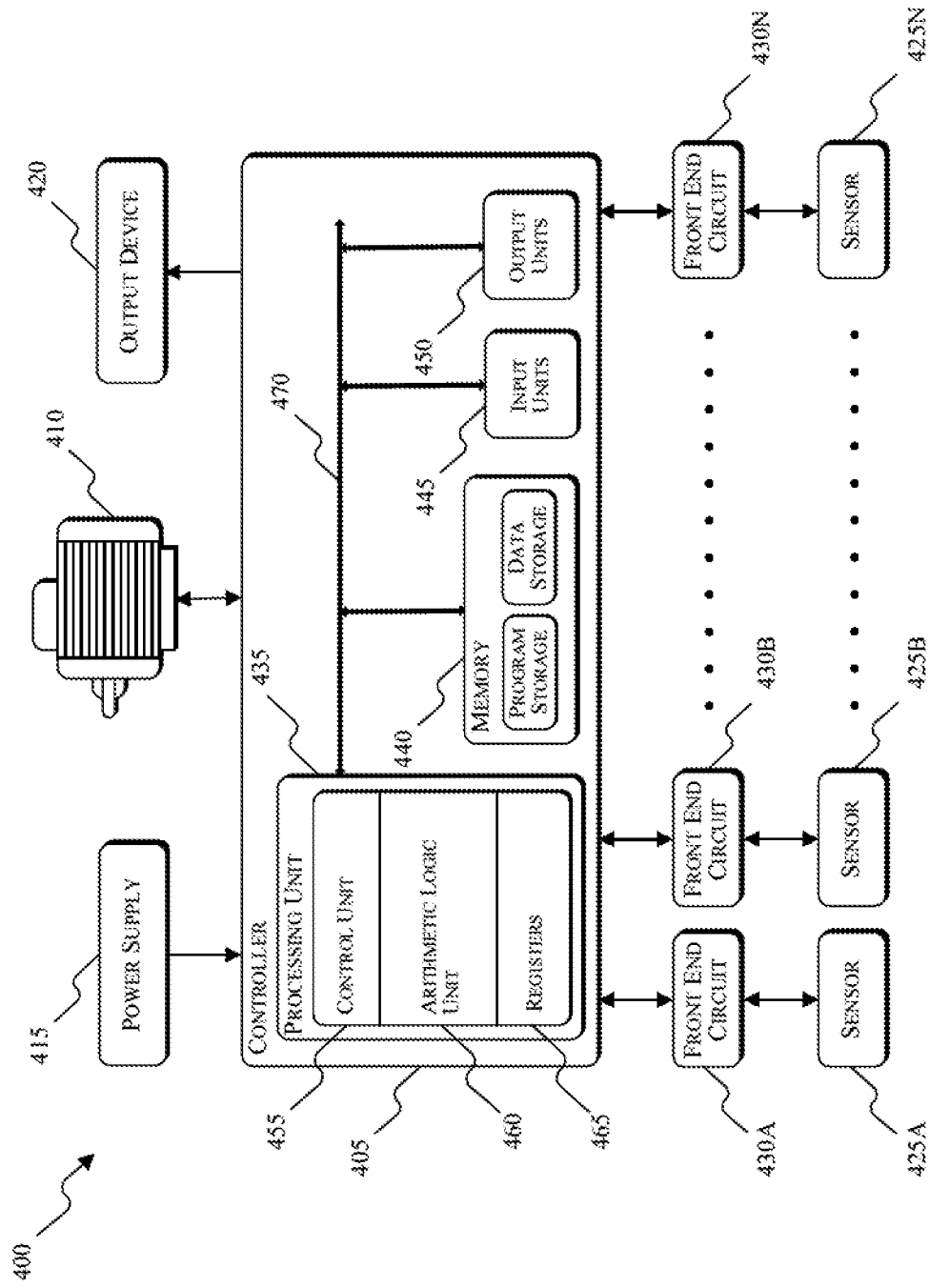
FIG. 5 is a block diagram of a sensor system according to another embodiment of the invention.

Specifically, FIG. 5 illustrates a sensor system 400 including a controller 405. The controller 405 is electrically and/or communicatively connected to a variety of modules or components of the system 400. For example, the illustrated controller 405 is connected to one or more actuation devices (i.e., motors) and drives 410, a power supply module 415, an output device 420, and a plurality of sensors 425A-425N (through corresponding front end circuitry 430A-430N), where N indicates some finite number of sensors included in the system 400. The controller 405 includes combinations of hardware and software that are operable to, among other things, monitor and/or control the operation of the system 400, control the movement of the actuation device 410, monitor the outputs of the Hall Effect sensors 425, etc.

In some embodiments, the controller 405 includes a plurality of electrical and electronic components that provide power, monitoring, and control to the system 400. For example, the controller 405 includes, among other things, a processing unit 435 (e.g., a microprocessor, a microcontroller, or another suitable programmable device), a memory 440, input units 445, and output units 450. The processing unit 435 includes, among other things, a control unit 455, an arithmetic logic unit ("ALU") 460, and a plurality of registers 465 (shown as a group of registers in FIG. 5), and is implemented using a known computer architecture, such as a modified Harvard architecture, a von Neumann architecture, etc. The processing unit 435, the memory 440, the input units 445, and the output units 450, as well as the various modules connected to the controller 405 are connected by one or more control and/or data buses (e.g., common bus 470). The control and/or data buses are shown generally in FIG. 5 for illustrative purposes. The use of one or more control and/or data buses for the interconnection between and communication among the various modules and components would be known to a person skilled in the art in view of the invention described herein. In some embodiments, the controller 405 is implemented partially or entirely on a semiconductor (e.g., an application specific integrated circuit ["ASIC"], a field-programmable gate array ["FPGA"] semiconductor) chip, etc.

The memory 440 includes, for example, a program storage area and a data storage area. The program storage area and the data storage area can include combinations of different types of memory, such as read-only memory ("ROM"), random access memory ("RAM") (e.g., dynamic RAM ["DRAM"], synchronous DRAM ["SDRAM"], etc.), electrically erasable programmable read-only memory ("EEPROM"), flash memory, a hard disk, an SD card, or other suitable magnetic, optical, physical, or electronic memory devices. The processing unit 435 is connected to the memory 440 and executes software instructions that are capable of being stored in a RAM of the memory 440 (e.g., during execution), a ROM of the memory 440 (e.g., on a generally permanent basis), or another non-transitory computer readable medium such as another memory or a disc. Software included in the implementation of the system 400 can be stored in the memory 440 of the controller 405. The software includes, for example, firmware, one or more applications, program data, filters, rules, one or more program modules, and other executable instructions. The controller 405 is configured to retrieve from memory and execute, among other things, instructions related to the control processes and methods described herein. In other constructions, the controller 405 includes additional, fewer, or different components.

The power supply module 415 supplies a nominal AC or DC voltage to the controller 405 or other components or modules of the system 400. The power supply module 415 is powered by, for example, a power source having nominal line voltages between 100V and 240V AC and frequencies of approximately 50-60 Hz. The power supply module 415 is also configured to supply lower voltages to operate circuits and components within the controller 405. In other constructions, the controller 405 or other components and modules within the system 400 are powered by one or more batteries or battery packs, or another grid-independent power source (e.g., a generator, a solar panel, etc.).

Figure 6:
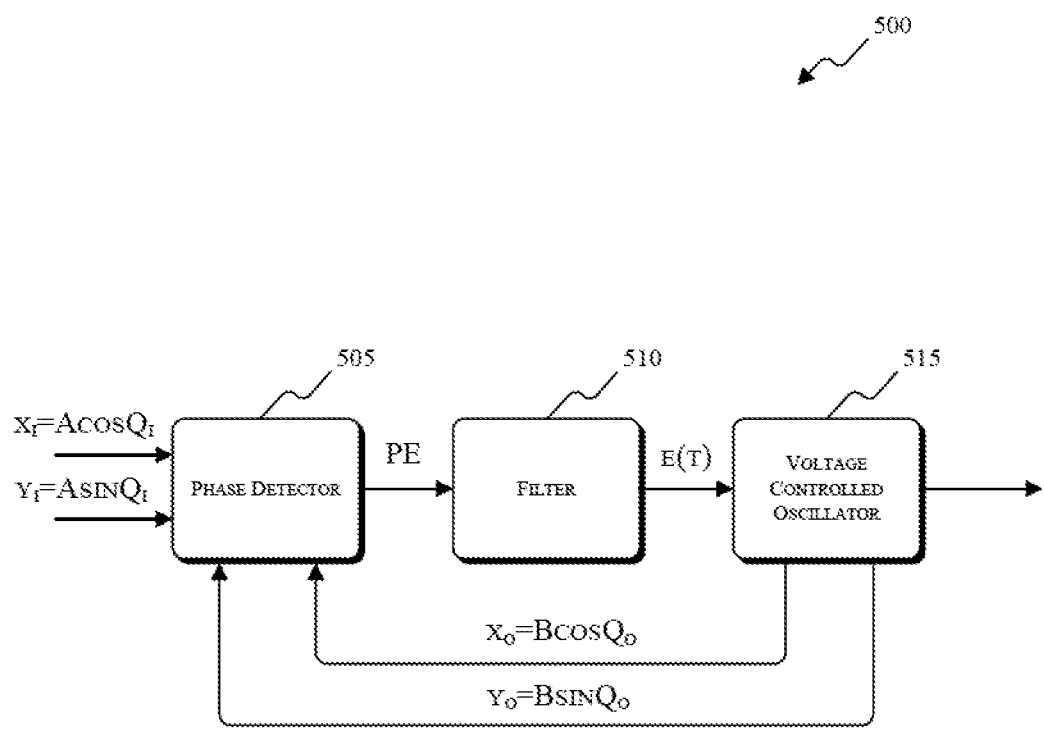
FIG. 6 illustrates an interpolator according to an embodiment of the invention.

FIG. 6 illustrates an interpolator 500 (e.g., implementing a quadrature phase-locked loop) that includes a phase detector ("PD") or phase comparator 505, a filter 510, and a voltage controlled oscillator 515. The interpolator 500 can be implemented as a stand-alone circuit, as a circuit integral to an encoder, using a processing device (see FIG. 5), etc. An encoder, such as the rotary incremental encoder in FIG. 2, generates a pair of quadrature sinusoids (i.e., two sinusoidal waveforms that should be phase shifted by 90°), which are input to the interpolator 500. Ideally, the input quadrature sinusoids to the interpolator 500 have the following values in EQNS. 1 and 2:

$$x_i = A \cos(Q_i) \qquad \text{EQN. 1}$$

$$y_i = A \sin(Q_i) \qquad \text{EQN. 2}$$

These signals are provided to the phase detector 505. Within the interpolator 500 are, for example, high resolution digital lookup tables ("LUTs") that provide sinusoidal data that have a 90° phase difference (e.g., sine and cosine signals). The internal interpolator signals which are output from the LUTs have values corresponding to EQNS. 3 and 4:

$$x_o = B \cos(Q_o) \qquad \text{EQN. 3}$$

$$y_o = B \sin(Q_o) \qquad \text{EQN. 4}$$

The sine and cosine data are then provided back to the phase detector 505. The phase detector calculates the phase difference between the quadrature sinusoidal signals of EQNS. 1 and 2 and the quadrature sinusoidal signals of EQNS. 3 and 4 and can include, for example, a pair of multiplying type digital-to-analog converters ("DACs") which mix the incoming signals with the internal interpolator signals as show below in EQNS. 5 and 6:

$$x_i * y_o = z_1 \qquad \text{EQN. 5}$$

$$y_i * x_o = z_2 \qquad \text{EQN. 6}$$

where $x_o$ and $y_o$ are the digital sine and cosine data, and A and B are respective signal amplitudes for the incoming signals and the internal interpolator signals.

The output, PE, of the phase detector 505 has a value corresponding to EQN. 7, which sums the results of EQNS. 5 and 6:

$$PE = z_1 - z_2 = AB \sin(Q_o - Q_i) \qquad \text{EQN. 7}$$

The output, PE, of the phase detector 505 is filtered by the filter 510 (e.g., a low-pass filter). The filtered signal is provided to the voltage controlled oscillator 515, which includes the digital sine and cosine LUTs in some embodiments.

The interpolator 500 of FIG. 6 includes an additional module that is configured to modify the phase difference between the two internal signals of the interpolator. As such, if the phase difference between two input signals, which is supposed to be 90°, is instead greater than or less than 90°, the interpolator can compensate the internal interpolator signals such that the phase difference between the received signals and the internal interpolator signals match one another. The new module is a compensation module or logic adder module that modifies the phase difference between internal sine and cosine signals within the interpolator. When the feedback loop controls the phase difference to a desirable value or range, the interpolator 500 is considered as in-lock, the interpolator 500 outputs the index values of the lookup table, and the interpolator 500 generates high resolution digital output signals based on the outputs from the LUTs.

However, if there is a mechanical incompatibility or mismatch between, for example, the encoder pattern length and the length of the sensor array, the incoming signals correspond to EQNS. 8 and 9:

$$x_i = A \cos(Q_i + Q_d) \quad \text{EQN. 8}$$

$$y_i = A \sin(Q_i) \quad \text{EQN. 9}$$

where $Q_d$ corresponds to an error or offset that results from the length mismatch, and introduces an error into the output of the interpolator 500. The compensation module can be used to match the phase difference between the incoming signals and the internal interpolator signals.

Figure 7:
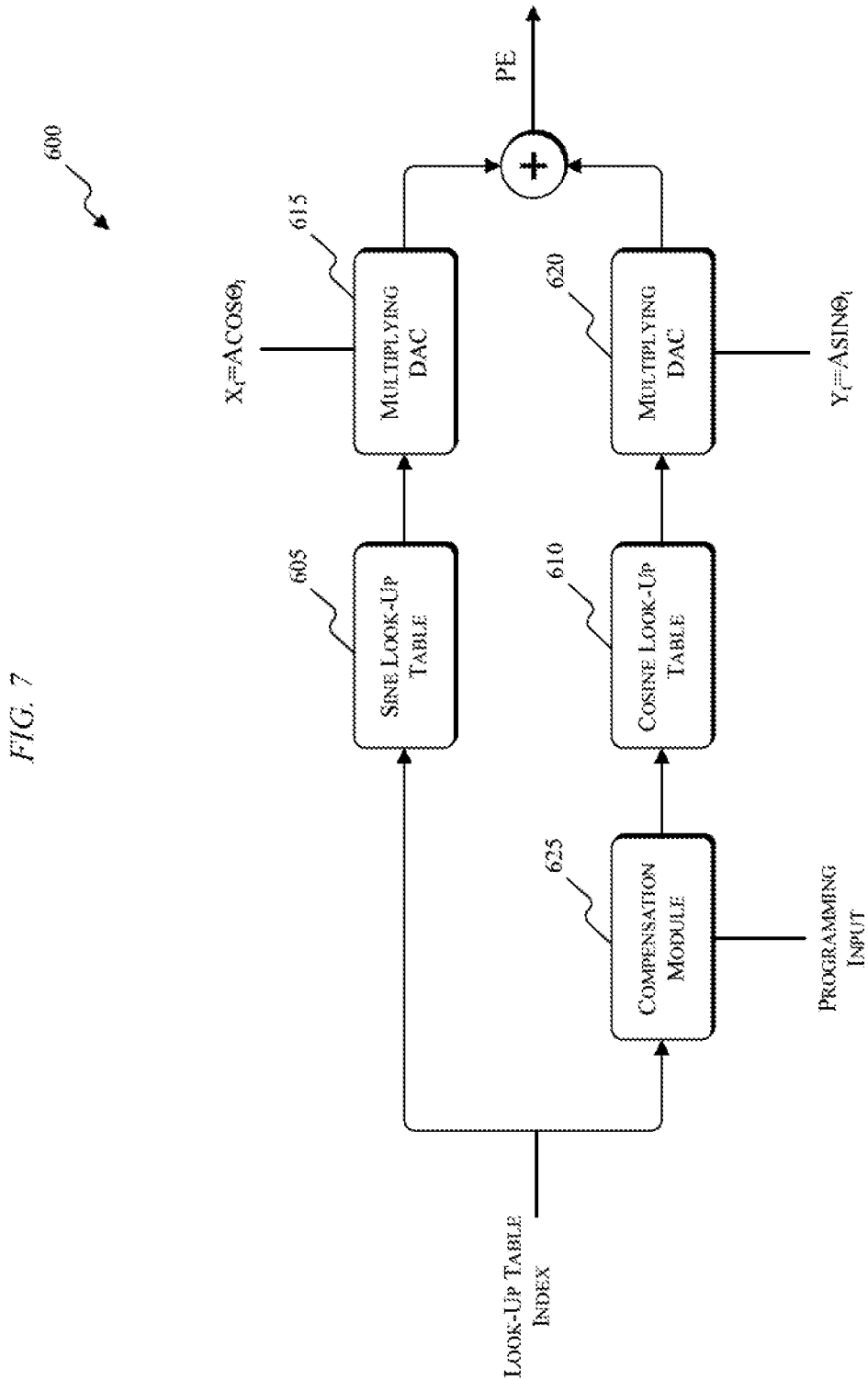
FIG. 7 illustrates a portion of an interpolator according to an embodiment of the invention.

For example, FIG. 7 illustrates a portion of an interpolator 600 according to an embodiment of the invention. The interpolator 600 includes a sine LUT 605, a cosine LUT 610, a first multiplying DAC 615, a second multiplying DAC 620, and a compensation module 625. In some embodiments, the compensation module 625 can be included with the cosine LUT 610, and the cosine LUT 610 can include compensated data. As illustrated, at least one of the LUT indexes that are used to retrieve the interpolator's internal sine and cosine signals is modified by the compensation module 625 to account for a difference in the phase difference of the input signals (e.g., a difference from 90°). The LUT index points to a specific set of high resolution data in each of the LUTs 605 and 610. The compensation module 625 need only be combined with one of the LUTs (e.g., either sine or cosine). In the embodiment of FIG. 7, the compensation module is associated with the cosine LUT. A programming input, indicating the amount, level, value, etc., required for compensation is provided to the compensation module 625 to modify the LUT index for the cosine LUT 610.

The phase difference between the incoming signals can be determined using hardware and/or software. For example, the interpolator determines that the phase difference between the incoming signals is not substantially 90° and determines how much compensation is required. Additionally or alternatively, when an encoder is manufactured with a known offset, the offset can be programmed into the interpolator such that correct compensation is provided, or the interpolator can be reprogrammed or field programmed to compensate for the offset in the incoming signals (e.g., if the offset was introduced after manufacturing).

In each implementation, the compensation module 625 adds a value, $Q_d$, to the LUT index. As such, the output signals from the LUTs are represented by EQNS. 10 and 11:

$$x_o = B \cos(Q_o + Q_d) \quad \text{EQN. 10}$$

$$y_o = B \sin(Q_o) \quad \text{EQN. 11}$$

The introduction of the compensation value causes the LUT 610 to return high resolution cosine data that has a phase difference other than 90° and that corresponds to or substantially equals the phase difference between the incoming signals (e.g., within an acceptable or known tolerance for the sensor system, such as +/−1%, +/−5%, +/−10%, +/−20%, etc., or some value therein).

The output of the phase detector 505 (see FIG. 6) is then represented by EQN. 12:

$$PE = AB \sin(Q_o - Q_i)\cos(Q_d) \quad \text{EQN. 12}$$

Thus, the output of the interpolator has no error or a minimum error. The value, $Q_d$, for modifying the phase difference of the internal interpolator signals causes only a change in feedback gain, which is small enough to be tolerated or can be compensated (e.g., using an amplifier, etc.).

Figure 8:
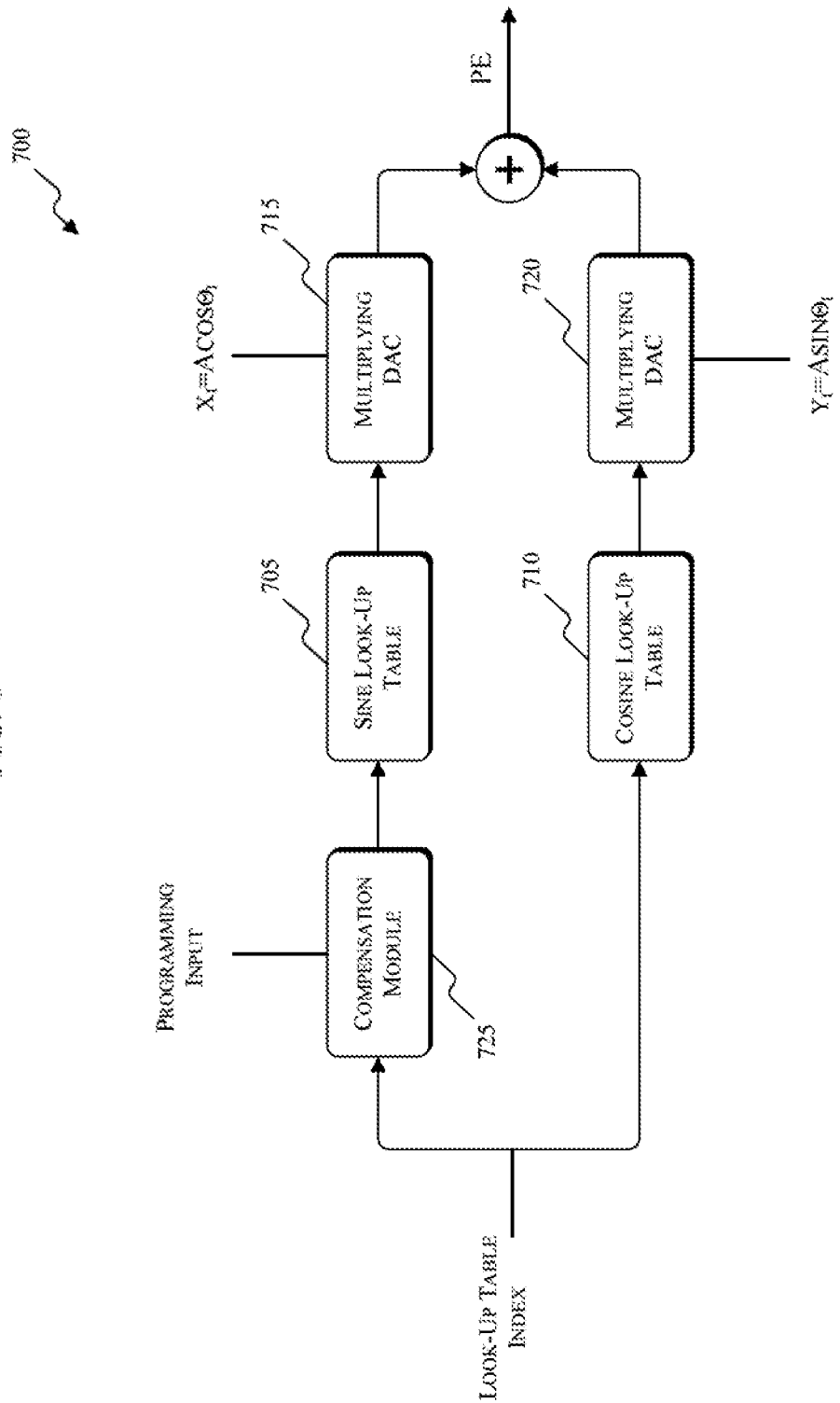
FIG. 8 illustrates a portion of an interpolator according to another embodiment of the invention.
Figure 9:
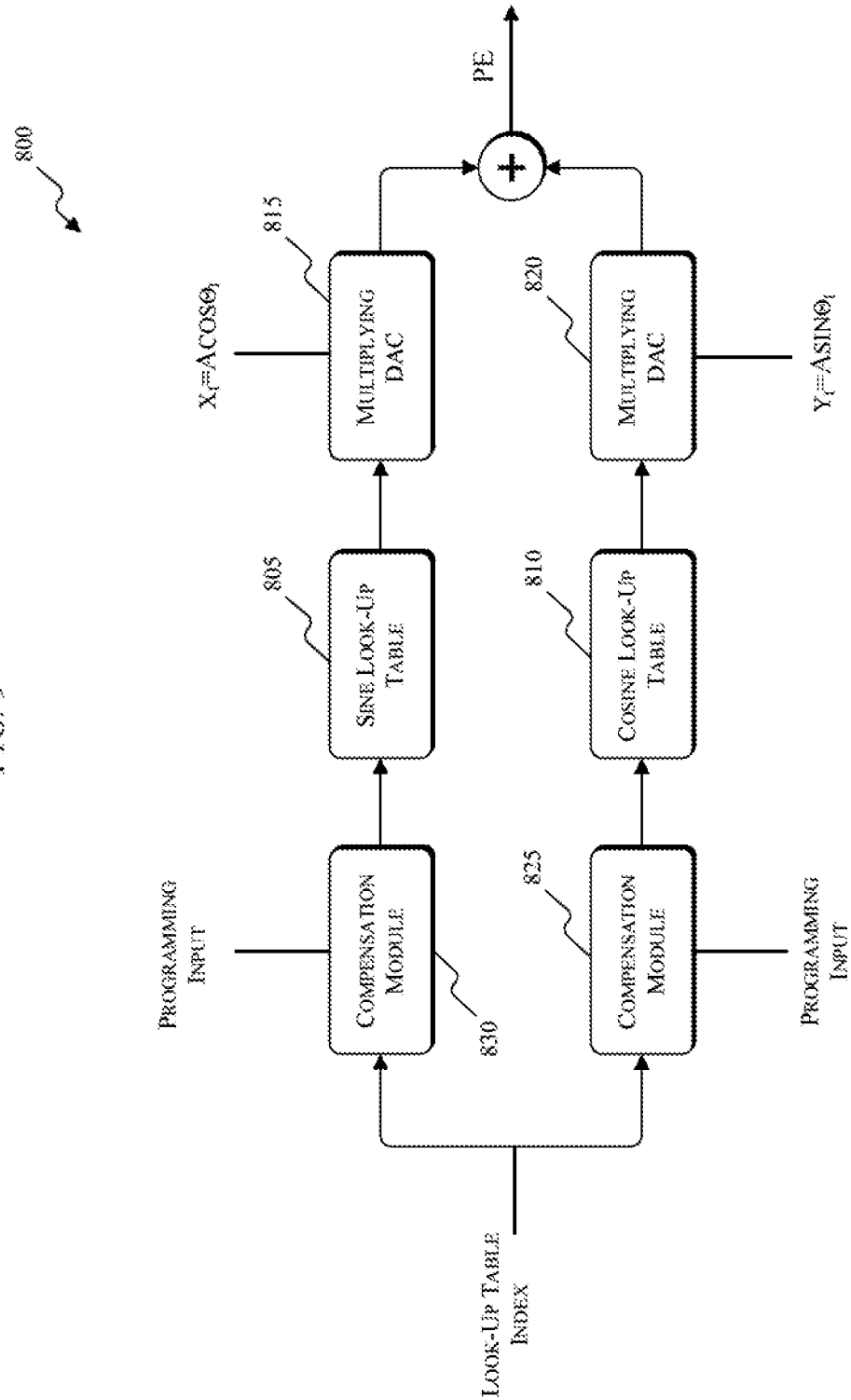
FIG. 9 illustrates a portion of an interpolator according to another embodiment of the invention.

FIG. 8 illustrates a portion of an interpolator 700 according to another embodiment of the invention. The interpolator 700 includes a sine LUT 705, a cosine LUT 710, a first multiplying DAC 715, a second multiplying DAC 720, and a compensation module 725. In some embodiments, the compensation module 725 can be included with the sine LUT 705, and the sine LUT 705 can include compensated data. In FIG. 8, the compensation module 725 is associated with the sine LUT 705. FIG. 9 illustrates a portion of an interpolator 800 according to another embodiment of the invention. The interpolator 800 includes a sine LUT 805, a cosine LUT 810, a first multiplying DAC 815, a second multiplying DAC 820, a first compensation module 825, and a second compensation module 830. In FIG. 9, compensation modules are provided for each of the sine LUT 805 and the cosine LUT 810. The operation of interpolators 700 and 800 in FIGS. 8 and 9 is similar to that described above. However, in FIG. 8, the compensation term, $Q_d$, from a compensation module 725 is added to EQN. 4 rather than EQN. 3. In FIG. 9, the two compensation modules 825 and 830 each introduce a compensation term for the cosine LUT 810 and the sine LUT 805, respectively. In some embodiments, the compensation module 825 can be included with the cosine LUT 810, and the cosine LUT 810 can include compensated data. Additionally or alternatively, the compensation module 830 can be included with the sine LUT 805, and the sine LUT 805 can include compensated data.

Thus, the invention provides, among other things, a programmable interpolator for a sensor system that compensates for variations or mismatches between an encoder and a sensor array. Various features and advantages of the invention are set forth in the following claims.

What is claimed is:

1. A sensor system comprising:
 a movable member;
 a sensor configured to generate a first output signal and a second output signal, the first output signal having a first phase angle, the second output signal having a second phase angle, a first difference between the first phase angle and the second phase angle having a first value, the first value of the first difference including an offset related to a mechanical incompatibility between the sensor and the movable member; and
 an interpolator configured to receive the first output signal and the second output signal, the interpolator operable to apply a compensation factor to generate a third signal having a third phase angle, and generate a fourth signal having a fourth phase angle, a second difference between the third phase angle and the fourth phase angle having a second value, the second value of the second difference substantially equaling the first value of the first difference, the compensation factor having a value that is based on the mechanical incompatibility between the sensor and the movable member.

2. The sensor system of claim 1, wherein the sensor is a Hall Effect sensor.

3. The sensor system of claim 1, wherein the first output signal and the second output signal are sinusoidal signals.

4. The sensor system of claim 1, wherein the movable member is a rotational member.

5. The sensor system of claim 1, wherein the first value of the first difference has a value of approximately 90 degrees plus the offset.

6. The sensor system of claim 1, wherein the interpolator includes a compensation module that modifies a look-up table index for a look-up table by the compensation factor for generating the third signal, the look-up table including high resolution sinusoidal signal data for generating the third signal.

7. The sensor system of claim 1, wherein the interpolator multiplies the first signal and the fourth signal to generate a fifth signal, multiplies the second signal and the third signal to generate a sixth signal, and sums the fifth signal and the sixth signal to generate a seventh signal.

8. The sensor system of claim 7, wherein a value for the seventh signal is a function of a difference between the first value of the first difference and the second value of the second difference.

9. A method of compensating for a mechanical incompatibility between a movable member and a sensor in an encoder, the method comprising:
generating a first output signal and a second output signal, the first output signal having a first phase angle, the second output signal having a second phase angle, a first difference between the first phase angle and the second phase angle having a first value, the first value of the first difference including an offset related to the mechanical incompatibility between the sensor and the movable member;
receiving, at an interpolation module, the first output signal and the second output signal;
determining a compensation factor, the compensation factor having a value that is based on the mechanical incompatibility between the sensor and the movable member;
generating a third signal using the compensation factor, the third signal having a third phase angle; and
generating a fourth signal having a fourth phase angle, wherein a second difference between the third phase angle and the fourth phase angle has a second value, the second value of the second difference substantially equaling the first value of the first difference.

10. The method of claim 9, wherein the sensor is a Hall Effect sensor.

11. The method of claim 9, wherein the first output signal and the second output signal are sinusoidal signals.

12. The method of claim 9, wherein the encoder is an incremental rotary encoder.

13. The method of claim 9, wherein the first value of the first difference has a value of approximately 90 degrees plus the offset.

14. The method of claim 9, further comprising modifying a look-up table index for a look-up table by the compensation factor for generating the third signal, the look-up table including high resolution sinusoidal signal data for generating the third signal.

15. The method of claim 9, further comprising multiplying the first signal and the fourth signal to generate a fifth signal, multiplying the second signal and the third signal to generate a sixth signal, and summing the fifth signal and the sixth signal to generate a seventh signal.

16. The method of claim 15, wherein a value for the seventh signal is a function of a difference between the first value of the first difference and the second value of the second difference.

17. A sensor system comprising:
a rotary member including a pattern of magnetic poles;
a Hall Effect sensor array configured to generate a first output signal and a second output signal based on the pattern of magnetic poles, the first output signal having a first phase angle, the second output signal having a second phase angle, a first difference between the first phase angle and the second phase angle having a first value, the first value of the first difference including an offset related to a mechanical incompatibility between the Hall Effect sensor array and the rotary member; and
a controller configured to receive the first output signal and the second output signal, the controller operable to apply a compensation factor to generate a third signal having a third phase angle and generate a fourth signal having a fourth phase angle, a second difference between the third phase angle and the fourth phase angle having a second value, the second value of the second difference substantially equaling the first value of the first difference, the compensation factor having a value that is set based on the mechanical incompatibility between the Hall Effect sensor array and the rotary member.

18. The sensor system of claim 17, wherein the first value of the first difference has a value of approximately 90 degrees plus the offset.

19. The sensor system of claim 17, wherein the controller includes a compensation module that modifies a look-up table index for a look-up table by the compensation factor for generating the third signal, the look-up table including high resolution sinusoidal signal data for generating the third signal.

20. The sensor system of claim 17, wherein the interpolator multiplies the first signal and the fourth signal to generate a fifth signal, multiplies the second signal and the third signal to generate a sixth signal, and sums the fifth signal and the sixth signal to generate a seventh signal.

21. The sensor system of claim 20, wherein a value for the seventh signal is a function of a difference between the first value of the first difference and the second value of the second difference.

* * * * *